(12) United States Patent
Ren et al.

(10) Patent No.: US 9,638,973 B2
(45) Date of Patent: May 2, 2017

(54) ARRAY SUBSTRATE, FAULT LINE REPAIR METHOD AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Xingfeng Ren, Beijing (CN); Chong Fang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/158,108

(22) Filed: May 18, 2016

(65) Prior Publication Data

US 2016/0370675 A1    Dec. 22, 2016

(30) Foreign Application Priority Data

Jun. 17, 2015    (CN) .......................... 2015 1 0336873

(51) Int. Cl.
*H01L 27/00*    (2006.01)
*G02F 1/1362*    (2006.01)
(Continued)

(52) U.S. Cl.
CPC ...... *G02F 1/136259* (2013.01); *G02F 1/1368* (2013.01); *G02F 1/13439* (2013.01); *G02F 1/134309* (2013.01); *G02F 1/136286* (2013.01); *H01L 23/5226* (2013.01); *H01L 27/124* (2013.01); *H01L 27/1244* (2013.01); *H01L 27/3246* (2013.01); *H01L 27/3248* (2013.01); *H01L 27/3276* (2013.01);
(Continued)

(58) Field of Classification Search
CPC ............... H01L 27/124; H01L 27/3276; H01L 27/3246; H01L 27/3248; H01L 23/5226
See application file for complete search history.

(56) References Cited

U.S. PATENT DOCUMENTS

| 6,340,963 B1* | 1/2002 | Anno .................... G02F 1/1309 345/206 |
| 2002/0044229 A1* | 4/2002 | Kim ...................... G02F 1/1368 349/43 |

(Continued)

*Primary Examiner* — Ngan Ngo
(74) *Attorney, Agent, or Firm* — Banner & Witcoff, Ltd.

(57) ABSTRACT

An array substrate, a fault line repair method thereof, and a display device are provided. The array substrate includes: a base substrate; a gate line and a signal line which are arranged on the base substrate, adjacent gate lines and adjacent signal lines crossing with each other to define a pixel region; and a pixel electrode located in the pixel region. The array substrate further includes a common electrode corresponding to the pixel electrode. The common electrode includes: a frame; a first strip-shaped connection part arranged in the frame and having both ends thereof connected with the frame; and a second strip-shaped connection part connected with the first strip-shaped connection part in a crossed manner and having both ends thereof disconnected from the frame. The signal line is parallel with the second strip-shaped connection part and located directly above or directly under the second strip-shaped connection part.

15 Claims, 7 Drawing Sheets

(51) Int. Cl.
*H01L 27/12* (2006.01)
*G02F 1/1343* (2006.01)
*G02F 1/1368* (2006.01)
*H01L 23/522* (2006.01)
*H01L 27/32* (2006.01)

(52) U.S. Cl.
CPC ............ *G02F 2001/134318* (2013.01); *G02F 2001/136263* (2013.01); *G02F 2001/136272* (2013.01)

(56) References Cited

U.S. PATENT DOCUMENTS

| | | | | |
|---|---|---|---|---|
| 2005/0078252 | A1* | 4/2005 | Lin | G02F 1/136209 349/139 |
| 2006/0158577 | A1* | 7/2006 | Katakura | G02F 1/136204 349/44 |
| 2007/0263134 | A1* | 11/2007 | Kim | G02F 1/136213 349/54 |
| 2009/0225017 | A1* | 9/2009 | Kim | G02F 1/133514 345/88 |
| 2010/0158347 | A1* | 6/2010 | He | G09G 3/006 382/149 |
| 2013/0050603 | A1* | 2/2013 | Ise | G02F 1/134363 349/43 |
| 2015/0287741 | A1* | 10/2015 | Wang | H01L 23/5226 257/71 |
| 2016/0033819 | A1* | 2/2016 | Li | G02F 1/133553 349/46 |
| 2016/0307937 | A1* | 10/2016 | Jin | H01L 27/1255 |
| 2016/0342053 | A1* | 11/2016 | Jiang | G02F 1/13 |
| 2016/0370666 | A1* | 12/2016 | Gao | G02F 1/134309 |

* cited by examiner

ARRAY SUBSTRATE, FAULT LINE REPAIR METHOD AND DISPLAY DEVICE

This application claims priority to and the benefit of Chinese Patent Application No. 201510336873.4 filed on Jun. 17, 2015, which application is incorporated herein in its entirety.

TECHNICAL FIELD

Embodiments of the present disclosure relate to an array substrate, a fault line repair method, and a display device

BACKGROUND

Liquid crystal molecules of a Thin Film Transistor Liquid Crystal Display (TFT-LCD) cannot be maintained under a certain constant voltage all the time, otherwise, the liquid crystal molecules degrade and cannot rotate in response to change of electric field to form different gray scales even though the certain constant voltage is canceled. Therefore, the voltage must be inverted every a certain period of time so that degradation of the characteristics of the liquid crystal molecules can be avoided.

In a manufacturing process of the TFT-LCD, a parallel-plate capacitor formed between a pixel electrode and a gate scanning line or a common electrode is employed as a storage capacitor Cs. The Cs formed between the pixel electrode and the common electrode is widely used because of its wide applicability. In a case that voltage of the common electrode is fixed all the time, positive polarity can be obtained as long as voltage of the pixel electrodes is provided to be greater than that of the common electrode, and negative polarity can be obtained as long as the voltage of the pixel electrodes is provided to be smaller than that of the common electrode. Therefore, the case that the voltage of the common electrode fixed is applicable to polarity inversion of various panels.

SUMMARY

According to embodiments of the disclosure, an array substrate is provided. The array substrate includes: a base substrate; a gate line and a signal line which are arranged on the base substrate, adjacent gate lines and adjacent signal lines crossing with each other to define a pixel region; and a pixel electrode located in the pixel region. The array substrate further includes a common electrode corresponding to the pixel electrode. The common electrode includes: a frame; a first strip-shaped connection part arranged in the frame and having both ends thereof connected with the frame; and a second strip-shaped connection part connected with the first strip-shaped connection part in a crossed manner and having both ends thereof disconnected from the frame. The signal line is parallel with the second strip-shaped connection part and located directly above or directly under the second strip-shaped connection part.

For example, the first strip-shaped connection part and the second strip-shaped connection part are crossed perpendicularly.

For example, a line width of the frame is 4 µm.

For example, a width of the first strip-shaped connection part is greater than that of the second strip-shaped connection part.

For example, a width of the second strip-shaped connection part is greater than that of the signal line.

For example, a long side of the frame is parallel with the signal line.

According to the embodiments of the disclosure, a fault line repair method of the above-described array substrate is provided. The method comprises: determining a short circuit position in the case that a short circuit occurs between the signal line and the common electrode, and cutting off the frame or the first strip-shaped connection part according to the short circuit position so that the common electrode and the signal line are disconnected from each other; determining an open circuit position in the case that an open circuit occurs to the signal line; according to the open circuit position, connecting the signal line and the second strip-shaped connection part and cutting off the first strip-shaped connection part, or connecting the signal line to the frame and the second strip-shaped connection part and cutting off the frame or cutting off both of the frame and the first strip-shaped connecting part; wherein a portion of the common electrode connected with the signal line serves as a part of the signal line, and a portion of the common electrode disconnected from the signal line serves as the common electrode; and cutting off the signal line on both sides of the gate line which is short-circuited with the signal line and connecting the cut-off signal line through a repair line in the case that a short circuit occurs to the signal line and the gate line, wherein a connection position of the repair line and the signal line is located in a gap between the second strip-shaped connection part and the frame.

For example, in the case that the short circuit occurs between the signal line and the common electrode, the method comprises: cutting off the first strip-shaped connection part at two cut-off positions in the case that the short circuit position of the signal line and the common electrode is located on the second strip-shaped connection part, wherein the two cut-off positions are located on the first strip-shaped connection part and are respectively located on both sides of the second strip-shaped connection part.

For example, in the case that the short circuit occurs between the signal line and the common electrode, the method comprises: cutting off the frame at two cut-off positions in the case that the short circuit position of the signal line and the common electrode is located on the frame, wherein the two cut-off positions are located on the frame and are respectively located on both sides of the signal line.

For example, in the case that the open circuit occurs to the signal line, the method comprises: in the case that the open circuit position of the signal line is located above the second strip-shaped connection part, respectively connecting two disconnected portions of the signal line to the second strip-shaped connection part, and disconnecting the first strip-shaped connection part from the frame by employing two cut-off positions, wherein the two cut-off positions are located on the first strip-shaped connection part and are respectively located on both sides of the second strip-shaped connection part.

For example, in the case that the open circuit occurs to the signal line, the method comprises: in the case that the open circuit position of the signal line is located between the second strip-shaped connection part and the frame, respectively connecting two disconnected portions of the signal line to the frame and the second strip-shaped connection part, and disconnecting the signal line from the common electrode by employing three cut-off positions, wherein two of the three cut-off positions are located on the frame, and another of the three cut-off positions is located on the first strip-shaped connection part.

For example, the two cut-off positions located on the frame are respectively located on both sides of the signal line, one of the two cut-off positions is located on a short side of the frame close to the open circuit position of the signal line, the other of the two cut-off positions is located on a long side of the frame, and the cut-off position located on the long side of the frame is located between the first strip-shaped connection part and a short side of the frame far away from the open circuit position of the signal line; and the cut-off position located on the first strip-shaped connection part and the cut-off position located on the short side of the frame are located on a same side of the signal line.

For example, in the case that the open circuit occurs to the signal line, the method comprises: in the case that the open circuit position of the signal line is located between the second strip-shaped connection part and the frame, respectively connecting two disconnected portions of the signal line to the frame and the second strip-shaped connection part, and disconnecting the signal line from the common electrode by employing two cut-off positions, wherein one of the two cut-off positions is located on one long side of the frame and located between the first strip-shaped connection part and a short side of the frame far away from the open circuit position of the signal line, and the other of the two cut-off positions is located on the other long side of the frame and located between the first strip-shaped connection part and the short side of the frame far away from the open circuit position of the signal line.

For example, in the case that the open circuit occurs to the signal line, the method comprises: in the case that the open circuit position of the signal line is located between the second strip-shaped connection part and the frame, respectively connecting two disconnected portions of the signal line to the frame and the second strip-shaped connection part, and disconnecting the signal line from the common electrode by employing four cut-off positions, wherein two cut-off positions are respectively located on both sides of a connection position which is located on the frame, and the other two cut-off positions are located on the first strip-shaped connection part and are respectively located on both sides of the second strip-shaped connection part.

According to the embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
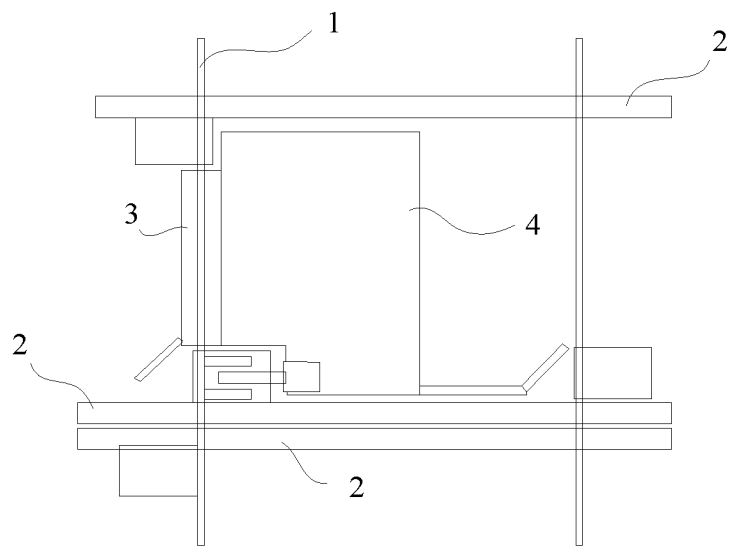
FIG. 1 is a top view illustrating an array substrate according to one technology.
Figure 2:
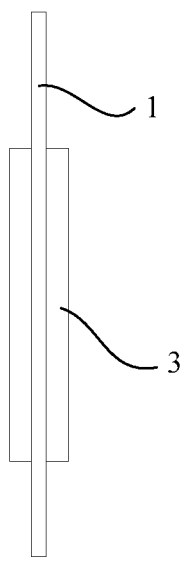
FIG. 2 is a schematic view illustrating a positional relationship of a common electrode and a signal line in the array substrate shown in FIG. 1.

An array substrate of the TFT-LCD is shown in FIG. 1. The array substrate comprises a base substrate; a gate line 2 and a signal line 1 which are arranged on the base substrate, adjacent gate lines 2 and adjacent signal lines 1 crossing with each other to define a pixel region; a pixel electrode 4 located in the pixel region; and a common electrode 3 corresponding to the pixel electrode 4 and located below the signal line 1. Structures of the signal line 1 and the common electrode 3 are shown in FIG. 2. In FIG. 2, it can be seen that an integral and solid pattern is adopted for the common electrode 3, and the signal line 1 is located above the common electrode 3.

In a process of manufacturing the array substrate, an open circuit may occur to the signal line 1, a short circuit may occur between the signal line 1 and the common electrode 3, a short circuit may occur between the signal line 1 and the gate line 2, and other faults of the single line and/or the gate line may occur. At the time of repairing the fault line, cutting or perforating may be carried out and consequently a new short circuit between the signal line 1 and the common electrode 3 may be caused; and in this case, the common electrode 3 needs to be cut off so that the repair process is complicated. In addition, in a process of cutting off the common electrode 3, the pixel electrode 4 and the common electrode 3 may be fusion-welded together so that a repairing success rate is decreased; and continuous fault pixel regions may be caused in the case that the common electrode 3 is cut off Embodiments of the present disclosure provide an array substrate, a fault line repair method, and a display device. By designing a pattern of a common electrode, repair efficiency is improved in the case that a fault line occurs.

Figure 3:
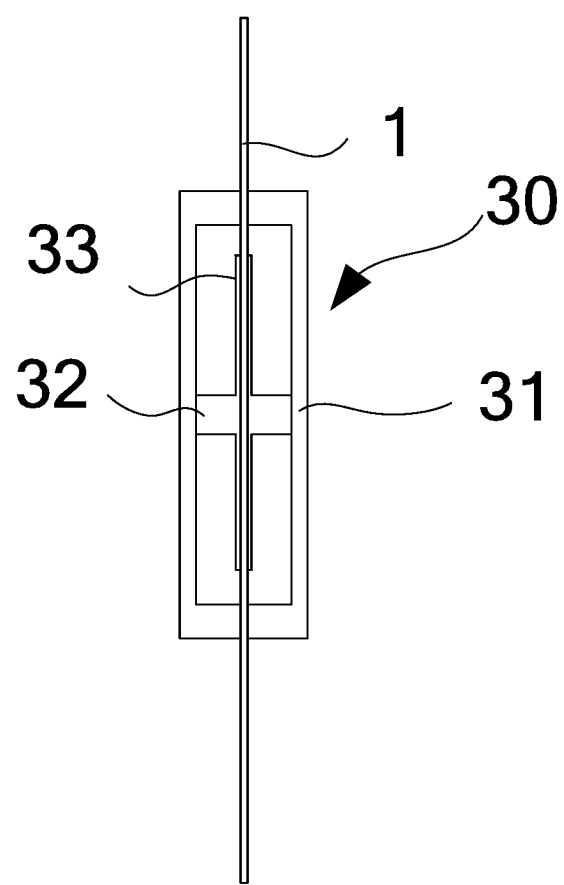
FIG. 3 is a structural schematic view illustrating a signal line and a common electrode of an array substrate according to embodiments of the present disclosure.

Embodiments of the present disclosure provide an array substrate. The array substrate comprises a base substrate; a gate line and a signal line 1 which are arranged on the base substrate, adjacent gate lines and adjacent signal lines crossing with each other to define a pixel region; a pixel electrode located in the pixel region; and a common electrode 30 corresponding to each pixel electrode. As shown in FIG. 3, the common electrode 30 includes a frame 31; a first strip-shaped connection part 32 arranged in the frame 31 and having both ends thereof connected with the frame 31; and a second strip-shaped connection part 33 connected with the first strip-shaped connection part 32 in a crossed manner and having both ends thereof disconnected from the frame 31. The signal line 1 is parallel with the second strip-shaped connection part 33 and located directly above or directly under the second strip-shaped connection part 33.

Structures of the pixel electrode, the gate line and the signal line in the embodiments of the present disclosure may refer to FIG. 1, which will not be repeated herein.

In the embodiments of the present disclosure, a structure of the common electrode 30 is changed. The common electrode 30 includes the frame 31, and the first strip-shaped connection part 32 and the second strip-shaped connection part 33 which are arranged in the frame 31 in the crossed manner; and the signal line 1 is parallel with the second strip-shaped connection part 33 and is located directly above or directly under the second strip-shaped connection part 33. FIG. 3 is a top view illustrating the signal line 1 and the second strip-shaped connection part 33 viewed from a direction perpendicular to the array substrate. Besides, both ends of the second strip-shaped connection part 33 are not directly connected with the frame 31, and the second strip-shaped connection part 33 is connected with the frame 31 through the first strip-shaped connection part 32 which is connected with the second strip-shaped connection part 32 in the crossed manner. In FIG. 3, it can be seen that in the case that a short circuit occurs between the signal line 1 and the common electrode 30 in the embodiments of the present disclosure, repairing is completed by cutting off the frame 31 or the first strip-shaped connection part 32; in the case that an open circuit occurs to the signal line 1, repairing is completed by connecting the signal line 1 and the second strip-shaped connection part 33 together and disconnecting the first strip-shaped connection part 32 from the frame 31, or repairing is completed by connecting the signal line 1 to the frame 31 and the second strip-shaped connection part 33 and cutting off the frame 31 or cutting off both of the frame 31 and the first strip-shaped connection part 32. It can be seen that, in the array substrate according to the embodiments of the present disclosure, by changing the structure of the common electrode 30, the repairing process is simple and fast, meanwhile, other damages caused in the repairing process are avoided, and the repair efficiency is improved.

Next, the array substrate according to the embodiments of the present disclosure and the repair method of the fault line are described in detail in combination with the drawings.

Referring to FIG. 3, FIG. 3 is a top view viewed in a direction perpendicular to the array substrate. FIG. 3 illustrates the common electrode 30 and the signal line 1, the signal line 1 is located above the common electrode 30, and more specifically, the signal line 1 is located directly above the second-strip-shaped connection part 33. Alternatively, the signal line is located below the common electrode 30, and more specifically, the signal line 1 is located directly under the second-strip-shaped connection part 33.

In order to facilitate understanding, the common electrode 30 will be described in detail in combination with FIG. 3. The common electrode 30 includes the frame 31 and the first strip-shaped connection part 32 and the second strip-shaped connection part 33 provided in the frame 31, and the first strip-shaped connection part 32 and the second strip-shaped connection part 33 are arranged in the crossed manner; the two ends of the first strip-shaped connection part 32 are connected with the frame 31; and the two ends of the second strip-shaped connection part 32 are disconnected from the frame 31. In the case that the first strip-shaped connection part 32 and the second strip-shaped connection part 33 are crossed, different angles may be formed between the first strip-shaped connection part 32 and the second strip-shaped connection part 33. For example, the first strip-shaped connection part 32 and the second strip-shaped connection part 33 are crossed perpendicularly; in this case, manufacture of the common electrode is facilitated. For example, a long side of the frame 31 is parallel with the signal line 1, the first strip-shaped connection part 32 is perpendicular to the signal line 1, and the second strip-shaped connection part 33 is parallel with the signal line 1 and located directly under the signal line 1. In the structure of the common electrode 30, the frame 31 and the second strip-shaped connection part 33 are positions where a short circuit may occur between the signal line 1 and the common electrode 30, and the first strip-shaped connection part 32 serves as a connection piece for connecting the second strip-shaped connection part 33 and the frame 31. For example, a width of the first strip-shaped connection part 32 is greater than that of the second strip-shaped connection part 33. In the case that no problems occur to the signal line 1, the frame 31, the first strip-shaped connection part 32 and the second strip-shaped connection part 33 are together used as the common electrode, so that the common electrode has a greater area. In the case that a short circuit occurs to the signal line 1, the frame 31 or the first strip-shaped connection part 32 is cut off according to a short circuit position 5 of the signal line 1 and the common electrode 30, and a portion of the common electrode 30 which is not connected with the signal line after cutting off serves as the common electrode. In the embodiments of the present disclosure, only the frame 31 or the first strip-shaped connection part 32 needs to be cut off according to the short circuit position 5, and therefore the repair process is facilitated.

For example, as shown in FIG. 3, a length direction of the second strip-shaped connection part 33 is arranged in a length direction of the signal line 1, and a width of the second strip-shaped connection part 33 is greater than that of the signal line 1. The width of the second strip-shaped connection part 33 is greater than that of the signal line 1, so that in the case that an open circuit occurs to the signal line 1, the signal line 1 and the second strip-shaped connection part 33 is easily connected with each other by a welding process.

For example, an overall width of the frame 31 is 18 µm, a line width of the frame 31 is 4 µm (that is, a with of a side of the frame 31 parallel to the signal line is 4 µm), the width of the second strip-shaped connection part 33 is 5 µm, a distance from the second strip-shaped connection part 33 to a left side of the frame 31 and a distance from the second strip-shaped connection part 33 to a right side of the frame 31 are both 2.5 µm, that is to say, the second strip-shaped connection part 33 is located at a position of a center axis of the frame 31. For example, the line width of the frame 31 is set as 4 µm, so that cooperation of the common electrode and the pixel electrodes are guaranteed.

Figure 4:
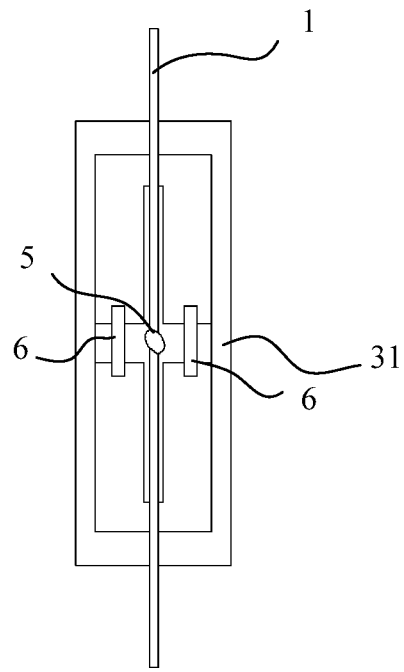
FIG. 4 is a repair schematic view in the case that a short circuit position of the signal line and the common electrode of the array substrate according to the embodiments of the present disclosure is located on a second strip-shaped connection part.
Figure 5:
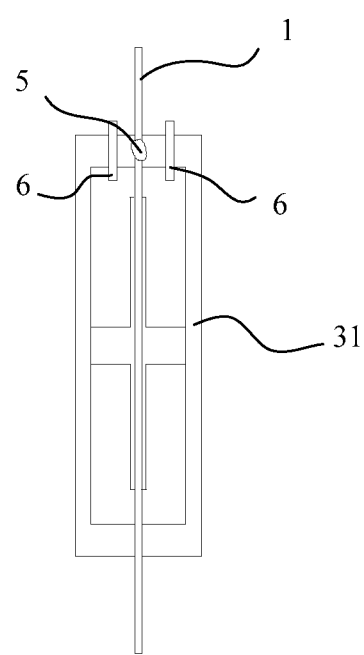
FIG. 5 is a repair schematic view in the case that the short circuit position of the signal line and the common electrode of the array substrate according to the embodiments of the present disclosure is located on a frame.
Figure 6:
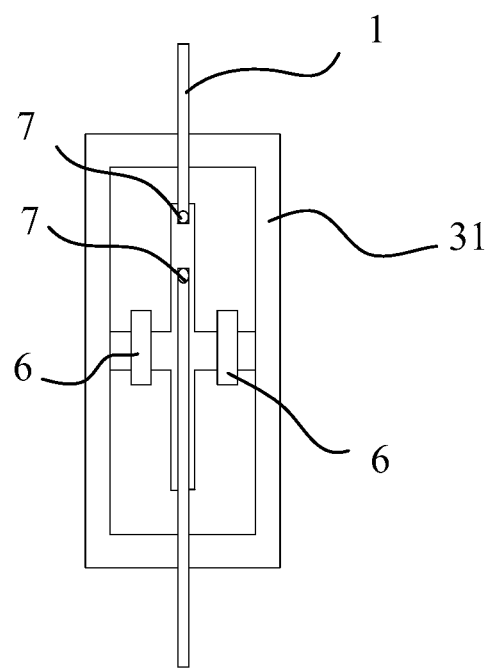
FIG. 6 is a repair schematic view in the case that an open circuit position of the signal line of the array substrate according to the embodiments of the present disclosure is located above the second strip-shaped connection part.
Figure 7:
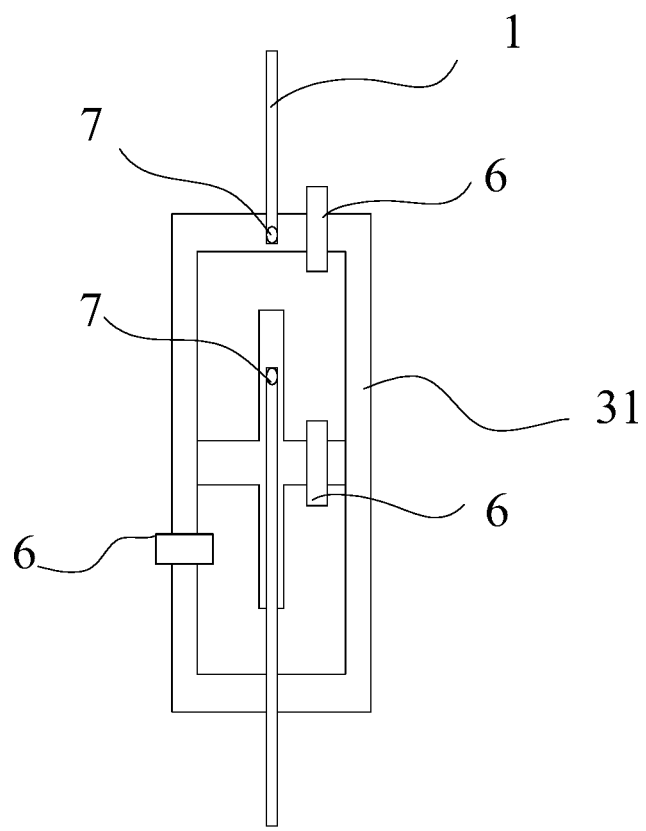
FIG. 7 is a first repair schematic view in the case that the open circuit position of the signal line of the array substrate according to the embodiments of the present disclosure is located between the frame and the second strip-shaped connection part.
Figure 8:
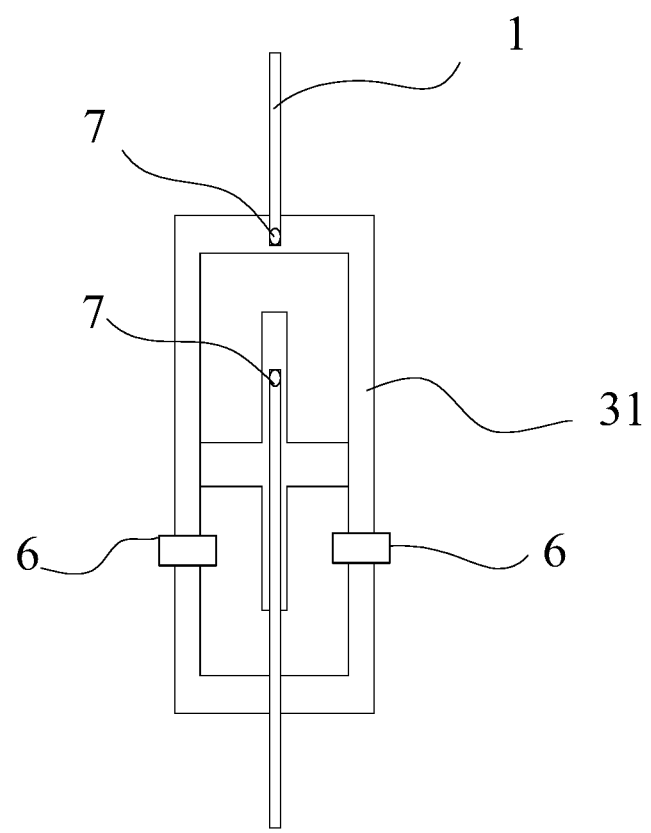
FIG. 8 is a second repair schematic view in the case that the open circuit position of the signal line of the array substrate according to the embodiments of the present disclosure is located between the frame and the second strip-shaped connection part.
Figure 9:
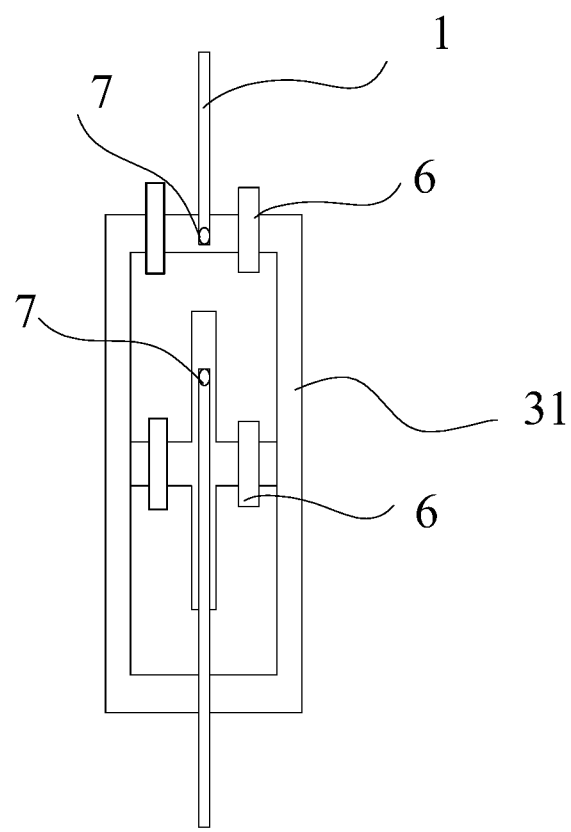
FIG. 9 is a third repair schematic view in the case that the open circuit position of the signal line of the array substrate according to the embodiments of the present disclosure is located between the frame and the second strip-shaped connection part.
Figure 10:
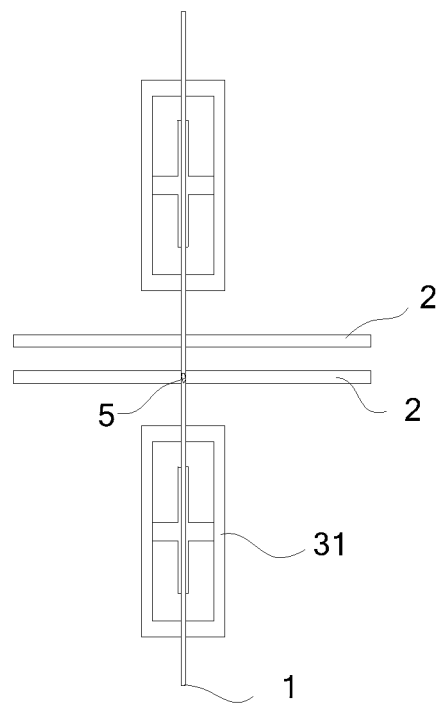
FIG. 10 is a schematic view illustrating the case that a short circuit occurs between the signal line and a gate line of the array substrate according to the embodiments of the present disclosure.
Figure 11:
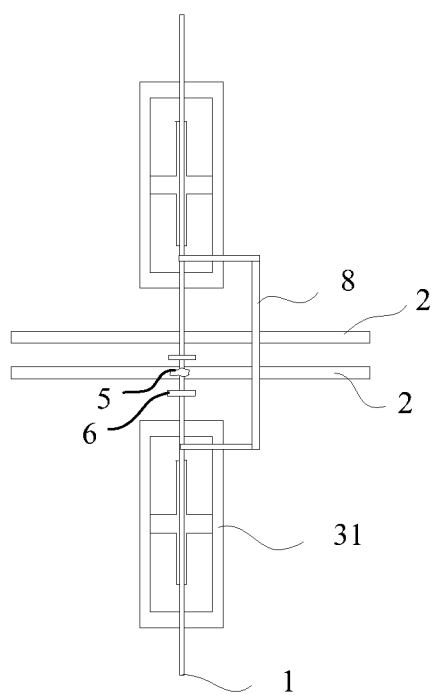
FIG. 11 is a repair schematic view in the case that the short circuit occurs between the signal line and the gate line of the array substrate according to the embodiments of the present disclosure.

Referring to FIGS. 4 to 11, the embodiments of the present disclosure further provide a repair method of the above-described array substrate. FIG. 4 is a repair schematic view in the case that the short circuit position of the signal line and the common electrode of the array substrate according to the embodiments of the present disclosure is located on the second strip-shaped connection part. FIG. 5 is a repair schematic view in the case that the short circuit position of the signal line and the common electrode of the array substrate according to the embodiments of the present disclosure is located on the frame. FIG. 6 is a repair schematic view in the case that the open circuit position of the signal line of the array substrate according to the embodiments of the present disclosure is located above the second strip-shaped connection part. FIG. 7 to FIG. 9 are repair schematic views in the case that the open circuit position of the signal line of the array substrate according to the embodiments of the present disclosure is located between the frame and the second strip-shaped connection part. FIG. 10 is a schematic view illustrating the case that the short circuit occurs between the signal line and the gate line of the array substrate according to the embodiments of the present disclosure. FIG. 11 is a repair schematic view in the case that the short circuit occurs between the signal line and the gate line of the array substrate according to the embodiments of the present disclosure.

For example, the repair method of the array substrate according to the embodiments of the present disclosure comprises:

Determining the short circuit position 5 in the case that the short circuit occurs between the signal line 1 and the common electrode 30, and cutting off the frame 31 or the first strip-shaped connection part 32 according to the short circuit position 5 so that the common electrode 30 and the signal line 1 are disconnected from each other;

Connecting the signal line 1 and the second strip-shaped connection part 33 for example by a welding process and cutting off the first strip-shaped connection part 32 in the case that the open circuit occurs to the signal line, or connecting the signal line 1 to the frame 31 and the second strip-shaped connection part 33 for example by the welding process and cutting off the frame 31 or cutting off both of the frame 31 and the first strip-shaped connecting part 32 in the case that the open circuit occurs to the signal line; a portion of the common electrode connected with the signal line serving as a part of the signal line, and a portion of the common electrode disconnected from the signal line serving as the common electrode;

Cutting off the signal line 1 on both sides of the gate line 2 which is short-circuited with the signal line 1 and connecting the cut-off signal line 1 through a repair line 8 in the case that the short circuit occurs to the signal line 1 and the gate line 2; a connection position of the repair line 8 and the signal line 1 being located in a gap between the second strip-shaped connection part 33 and the frame 31.

Hereinafter, the repair method according to the embodiments of the present disclosure will be described in detail.

Firstly, the repair of the short circuit between the signal line 1 and the common electrode 30 is described. FIG. 4 and FIG. 5 show different cases of the short circuit between the signal line 1 and the common electrode 30.

As seen from FIG. 3, the short circuit position 5 of the signal line 1 and the common electrode 30 occurs on the frame 31 or the second strip-shaped connection part 33.

In the case that the short circuit position 5 of the signal line 1 and the common electrode 30 is located on the second strip-shaped connection part 33, connection between the first strip-shaped connection part 32 and the frame 31 is cut off on both sides of the second strip-shaped connection part 33. As shown in FIG. 4, the short circuit position 5 of the signal line 1 and the common electrode 30 is located on the second strip-shaped connection part 33, the first strip-shaped connection part 32 is cut off so that the second strip-shaped connection part 33 is disconnected from the frame 31; in this case, the second strip-shaped connection part 33 and a portion of the first strip-shaped connection part 32 connected with the second strip-shaped connection part 33 are served as part of the signal line 1, and the frame 31 and a portion of the first strip-shaped connection part 32 connected with the frame 31 are disconnected from the signal line 1 and are served as the common electrode. As seen from FIG. 4, two cut-off positions 6 are located on the first strip-shaped connection part 32 and are respectively located on both sides of the second strip-shaped connection part 33. Because a gap exists between the second strip-shaped connection part 33 and the long side of the frame 31 and a gap exists between the first strip-shaped connection part 31 and the short side of the frame 31, there is enough space for performing an operation of cutting off, and meanwhile it is guaranteed that influences on other parts will not be caused at the time of cutting off.

In the case that the short circuit position 5 of the signal line 1 and the common electrode 30 is located on the frame 31, portions of the frame 31 on both sides of the signal line 1 are cut off. FIG. 5 shows that the short circuit position 5 of the signal line 1 and the common electrode 30 is located on the frame 31. As shown in FIG. 5, the frame 31 is cut off on both sides of the short circuit position 5; that is to say, two cut-off positions 6 are located on both sides of the signal line 1 respectively. After the frame 31 is cut off, a portion of the frame 31 connected with the signal line 1 serves as a part of the signal line 1, a portion of the frame 31 disconnected from the signal line 11, the first strip-shaped connection part 32 and the second strip-shaped connection part 33 serve as the common electrode 30. It can be seen from FIG. 5 that, the short side of the frame 31 is wider than the long side of the frame 31; because a position where the signal line 1 and the frame 31 are short-circuited is located on the wide side of the frame 31 and gaps exist between the wide side of the frame and the first strip-shaped connection part 33 and between the wide side of the frame and the second strip-shaped connection part 33, there is enough space to perform the operation of cutting off.

Next, the repair of the open circuit of the signal line 1 is described. FIG. 6 shows that an open circuit position is located on the second strip-shaped connection part 33, and FIGS. 7 to 9 show that the open circuit position is located in a gap between the frame 31 and the second strip-shaped connection part 33.

In the case that the open circuit position of the signal line 1 is located above the second strip-shaped connection part 33, two disconnected portions of the signal line 1 are respectively connected to the second strip-shaped connection part 33 for example by the welding process, and the first strip-shaped connection part 32 and the frame 31 are disconnected from each other. In FIG. 6, it can be seen that, in the case that the open circuit position of the signal line 1 is located above the second strip-shaped connection part 33, the two disconnected portions of the signal line 1 are respectively connected to the second strip-shaped connection part 33, and two connection positions 7 are provided as shown in FIG. 7. After the two disconnected portions of the signal line 1 are respectively connected to the second strip-shaped connection part 33, the signal line 1 and the common electrode 30 are in short circuit connection; in this case, the short circuit is repaired with reference to FIG. 4, that is, the first strip-shaped connection part 32 and the frame 31 are disconnected from each other, and the cut-off positions 6 are respectively located on both sides of the second strip-shaped connection part 33, as shown in FIG. 6. At the moment, the two disconnected portions of the signal line 1 are connected with each other through the second strip-shaped connection part 33, and meanwhile, the signal line 1 and the common electrode 30 are disconnected by cutting off the first strip-shaped connection part 32.

In the case that the open circuit position of the signal line 1 is located between the second strip-shaped connection part 33 and the frame 31, the two disconnected portions of the signal line 1 are respectively connected to the frame 31 and the second strip-shaped connection part 33 for example by the welding process, and the frame 31 and the first strip-shaped connection 32 are cut off so that the signal line and the common electrode 30 are disconnected from each other. As shown in FIG. 7, an end of one of the two disconnected portions of the signal line 1 is located on the frame 31, an end of the other of the two disconnected portions of the signal line 1 is located on the second strip-shaped connection part 33, and the two disconnected portions of the signal line 1 are respectively connected to the frame 31 and the second strip-shaped connection part 33 by the welding process. As shown in FIG. 7, two connection positions 7 are provided, one of the two connection positions 7 is located on the frame 31, and the other of the two connection position 7 is located on the second strip-shaped connection part 33. After the two disconnected portions of the signal line 1 are respectively connected to the frame 31 and the second strip-shaped connection part 33, the two disconnected portions of the signal line 1 are connected with each other through the frame 31, the first strip-shaped connection part 32 and the second strip-shaped connection part 33, but the short circuit also occurs between the signal line 1 and the common electrode 30. Thereafter, the frame 31 and the first strip-shaped connection part 32 are cut off so that the common electrode 30 and the signal line 1 are disconnected from each other. As shown in FIG. 7, three cut-off positions 6 are provided, two of the three cut-off positions 6 are located on the frame 31, and another of the three cut-off positions 6 is located on the first strip-shaped connection part 32. The two cut-off positions 6 located on the frame 31 are respectively located on both sides of the signal line 1, one cut-off position 6 is located on the short side of the frame 31 close to the open circuit position of the signal line 1, the other cut-off position 6 is located on the long side of the frame 31, and the cut-off position 6 located on the long side of the frame 31 is located between the first strip-shaped connection part 32 and the short side of the frame 31 far away from the open circuit position of the signal line 1; the cut-off position 6 located on the first strip-shaped connection part 32 and the cut-off position 6 located on the short side of the frame 31 are located on a same side of the signal line 1.

It should be noted that, for the case shown in FIG. 7, after the two disconnected portions of the signal line 1 are respectively connected to the frame 31 and the second strip-shaped connection part 33, the signal line 1 and the common electrode 30 may be disconnected from each other by other cutting manners. For example, as shown in FIG. 8, two cut-off positions 6 are provided, one of the two cut-off positions 6 is located on the long side of the frame 31 and located between the first strip-shaped connection part 32 and the short side of the frame 31 far away from the open circuit position of the signal line 1, and the other of the two cut-off positions 6 is located on the other long side of the frame 31 and located between the first strip-shaped connection part 32 and the short side of the frame 31 far away from the open circuit position of the signal line 1. For example, as shown in FIG. 9, four cut-off positions are provided, two cut-off positions 6 are respectively located on both sides of the connection position 7 which is located on the frame 31, and the other two cut-off positions 6 are located on the first strip-shaped connection part 32 and are respectively located on both sides of the second strip-shaped connection part 33.

Besides, the repair method according to the embodiments of the present disclosure further include the case of repairing the short circuit of the signal line 1 and the gate line 2. The case of the short circuit occurring to the signal line 1 and the gate line 2 is shown in FIG. 10, and the case of repairing the short circuit of the signal line 1 and the gate line 2 is shown in FIG. 11.

As shown in FIG. 11, the signal line 11 is cut off, two cut-off positions 6 are provided, and the two cut-off positions 6 are located on both sides of the gate line 2 which is short-circuited with the signal line 1. Hereinafter, the disconnected signal line 1 is connected through the repair line 8. As shown in FIG. 11, the repair line 8 is provided in a U-shaped manner, both ends of the repair line 8 connected with the signal line 1 are located in a gap between the frame 31 and the second strip-shaped connection part 33 of the common electrode 30. By adopting the connection manner described above, in the case that the repair line 8 is provided, there is enough space for connecting the signal line 1 and the repair line 8, the case that the repair line 8 is connected with the common electrode 30 is avoided at the time of connecting the signal line 1 and the repair line 8, and a repair effect is improved.

The embodiments of the present disclosure further provide a display device. The display device comprises the array substrate described above. For example, the display device according to the embodiments of the present disclosure is a mobile phone, a tablet personal computer, a TV set, a display, a notebook computer, a digital photo frame, a navigator or any product or component with a display function.

In the embodiments of the present disclosure, the structure of the common electrode 30 is changed. The common electrode 30 includes the frame 31, and the first strip-shaped connection part 32 and the second strip-shaped connection part 33 which are arranged in the frame 31 in the crossed manner, the signal line 1 is parallel with the second strip-shaped connection part 33 and is located directly above or directly under the second strip-shaped connection part 33, both ends of the second strip-shaped connection part 33 are not directly connected with the frame 31, and the second strip-shaped connection part 33 is connected with the frame 31 through the first strip-shaped connection part 32 which is connected with the second strip-shaped connection part 32 in the crossed manner. In the embodiments of the disclosure, in the case that the short circuit occurs between the signal line 1 and the common electrode 30, repairing is completed by cutting off the frame 31 or the first strip-shaped connection part 32; in the case that an open circuit occurs to the signal line 1, repairing is completed by connecting the signal line 1 and the second strip-shaped connection part 33 together and disconnecting the first strip-shaped connection part 32 from the frame 31, or repairing is completed by connecting the signal line 1 to the frame 31 and the second strip-shaped connection part 33 and cutting off the frame 31 or cutting off both of the frame 31 and the first strip-shaped connection part 32. In the embodiments of the present disclosure, by changing the structure of the common electrode 30, the repairing process is simple and fast, meanwhile, other damages caused in the repairing process are avoided, and the repair efficiency is improved.

The foregoing embodiments merely are exemplary embodiments of the disclosure, and not intended to define the scope of the disclosure, and the scope of the disclosure is determined by the appended claims.

The present application claims priority of Chinese Patent Application No. 201510336873.4 filed on Jun. 17, 2015, the present disclosure of which is incorporated herein by reference in its entirety as part of the present application.

The invention claimed is:

1. An array substrate, comprising: a base substrate; a gate line and a signal line which are arranged on the base substrate, adjacent gate lines and adjacent signal lines crossing with each other to define a pixel region; and a pixel electrode located in the pixel region, wherein,
the array substrate further comprises a common electrode corresponding to the pixel electrode; and
the common electrode comprises: a frame; a first strip-shaped connection part arranged in the frame and having both ends thereof connected with the frame; and a second strip-shaped connection part connected with the first strip-shaped connection part in a crossed manner and having both ends thereof disconnected from the frame, and the signal line is parallel with the second strip-shaped connection part and located directly above or directly under the second strip-shaped connection part.

2. The array substrate according to claim 1, wherein, the first strip-shaped connection part and the second strip-shaped connection part are crossed perpendicularly.

3. The array substrate according to claim 1, wherein, a line width of the frame is 4 μm.

4. The array substrate according to claim 1, wherein, a width of the first strip-shaped connection part is greater than that of the second strip-shaped connection part.

5. The array substrate according to claim 1, wherein, a width of the second strip-shaped connection part is greater than that of the signal line.

6. The array substrate according to claim 1, wherein, a long side of the frame is parallel with the signal line.

7. A fault line repair method of the array substrate according to claim 1, comprising:
determining a short circuit position in the case that a short circuit occurs between the signal line and the common electrode, and cutting off the frame or the first strip-shaped connection part according to the short circuit position so that the common electrode and the signal line are disconnected from each other;
determining an open circuit position in the case that an open circuit occurs to the signal line; according to the open circuit position, connecting the signal line and the second strip-shaped connection part and cutting off the first strip-shaped connection part, or connecting the signal line to the frame and the second strip-shaped connection part and cutting off the frame or cutting off both of the frame and the first strip-shaped connecting part; wherein a portion of the common electrode connected with the signal line serves as a part of the signal line, and a portion of the common electrode disconnected from the signal line serves as the common electrode; and
cutting off the signal line on both sides of the gate line which is short-circuited with the signal line and connecting the cut-off signal line through a repair line in the case that a short circuit occurs to the signal line and the gate line, wherein a connection position of the repair line and the signal line is located in a gap between the second strip-shaped connection part and the frame.

8. The fault line repair method according to claim 7, wherein, in the case that the short circuit occurs between the signal line and the common electrode, the method comprises:
cutting off the first strip-shaped connection part at two cut-off positions in the case that the short circuit position of the signal line and the common electrode is located on the second strip-shaped connection part, wherein the two cut-off positions are located on the first strip-shaped connection part and are respectively located on both sides of the second strip-shaped connection part.

9. The fault line repair method according to claim 7, wherein, in the case that the short circuit occurs between the signal line and the common electrode, the method comprises:
cutting off the frame at two cut-off positions in the case that the short circuit position of the signal line and the common electrode is located on the frame, wherein the two cut-off positions are located on the frame and are respectively located on both sides of the signal line.

10. The fault line repair method according to claim 7, wherein, in the case that the open circuit occurs to the signal line, the method comprises:
in the case that the open circuit position of the signal line is located above the second strip-shaped connection part, respectively connecting two disconnected portions of the signal line to the second strip-shaped connection part, and disconnecting the first strip-shaped connection part from the frame by employing two cut-off positions, wherein the two cut-off positions are located on the first strip-shaped connection part and are respectively located on both sides of the second strip-shaped connection part.

11. The fault line repair method according to claim 7, wherein, in the case that the open circuit occurs to the signal line, the method comprises:
in the case that the open circuit position of the signal line is located between the second strip-shaped connection part and the frame, respectively connecting two disconnected portions of the signal line to the frame and the second strip-shaped connection part, and disconnecting the signal line from the common electrode by employing three cut-off positions, wherein two of the three cut-off positions are located on the frame, and another of the three cut-off positions is located on the first strip-shaped connection part.

12. The fault line repair method according to claim 11, wherein,
the two cut-off positions located on the frame are respectively located on both sides of the signal line, one of the two cut-off positions is located on a short side of the frame close to the open circuit position of the signal line, the other of the two cut-off positions is located on a long side of the frame, and the cut-off position located on the long side of the frame is located between the first strip-shaped connection part and a short side of the frame far away from the open circuit position of the signal line; and the cut-off position located on the first strip-shaped connection part and the cut-off position located on the short side of the frame are located on a same side of the signal line.

13. The fault line repair method according to claim 7, wherein, in the case that the open circuit occurs to the signal line, the method comprises:

in the case that the open circuit position of the signal line is located between the second strip-shaped connection part and the frame, respectively connecting two disconnected portions of the signal line to the frame and the second strip-shaped connection part, and disconnecting the signal line from the common electrode by employing two cut-off positions, wherein one of the two cut-off positions is located on one long side of the frame and located between the first strip-shaped connection part and a short side of the frame far away from the open circuit position of the signal line, and the other of the two cut-off positions is located on the other long side of the frame and located between the first strip-shaped connection part and the short side of the frame far away from the open circuit position of the signal line.

14. The fault line repair method according to claim 7, wherein, in the case that the open circuit occurs to the signal line, the method comprises:

in the case that the open circuit position of the signal line is located between the second strip-shaped connection part and the frame, respectively connecting two disconnected portions of the signal line to the frame and the second strip-shaped connection part, and disconnecting the signal line from the common electrode by employing four cut-off positions, wherein two cut-off positions are respectively located on both sides of a connection position which is located on the frame, and the other two cut-off positions are located on the first strip-shaped connection part and are respectively located on both sides of the second strip-shaped connection part.

15. A display device, comprising the array substrate according to claim 1.

* * * * *